United States Patent
Preuss et al.

(10) Patent No.: US 8,748,201 B2
(45) Date of Patent: Jun. 10, 2014

(54) PROCESS FOR PRODUCING A LAYER COMPOSITE CONSISTING OF A LUMINESCENCE CONVERSION LAYER AND A SCATTERING LAYER

(75) Inventors: Stephan Preuss, Bad Abbach (DE); Thomas Bemmerl, Schwandorf (DE)

(73) Assignee: OSRAM Opto Semiconductors GmbH (DE)

( * ) Notice: Subject to any disclaimer, the term of this patent is extended or adjusted under 35 U.S.C. 154(b) by 8 days.

(21) Appl. No.: 13/817,596

(22) PCT Filed: Jul. 20, 2011

(86) PCT No.: PCT/EP2011/062470
§ 371 (c)(1),
(2), (4) Date: Apr. 17, 2013

(87) PCT Pub. No.: WO2012/022576
PCT Pub. Date: Feb. 23, 2012

(65) Prior Publication Data
US 2013/0210181 A1 Aug. 15, 2013

(30) Foreign Application Priority Data
Aug. 20, 2010 (DE) .......................... 10 2010 034 923

(51) Int. Cl.
*H01L 33/60* (2010.01)

(52) U.S. Cl.
USPC ................... 438/29; 264/21; 438/25; 438/27; 438/35

(58) Field of Classification Search
USPC .............................. 264/21; 438/25, 27, 29, 35
See application file for complete search history.

(56) References Cited

U.S. PATENT DOCUMENTS

| | | | |
|---|---|---|---|
| 5,641,564 A | 6/1997 | Thary | |
| 7,462,502 B2 * | 12/2008 | Paolini et al. | 438/22 |
| 7,553,683 B2 * | 6/2009 | Martin et al. | 438/29 |
| 8,232,564 B2 * | 7/2012 | Chakraborty | 257/88 |
| 8,445,929 B2 * | 5/2013 | Krames et al. | 257/98 |
| 8,547,015 B2 * | 10/2013 | Wolk et al. | 313/512 |
| 2005/0093430 A1 | 5/2005 | Ibbetson et al. | |
| 2005/0158893 A1 | 7/2005 | Silverbrook | |
| 2006/0186576 A1 | 8/2006 | Takase et al. | |
| 2007/0001182 A1 * | 1/2007 | Schardt et al. | 257/98 |

(Continued)

FOREIGN PATENT DOCUMENTS

| | | |
|---|---|---|
| DE | 10 2006 051 746 A1 | 4/2008 |
| DE | 10 2007 017 855 A1 | 10/2008 |

(Continued)

*Primary Examiner* — Asok K Sarkar
(74) *Attorney, Agent, or Firm* — DLA Piper LLP (US)

(57) ABSTRACT

A process of producing a layer composite includes a luminescence conversion layer and a scattering layer, wherein a press having a first pressing tool with a cavity and a second pressing tool is used including introducing a first polymer including a luminescence conversion substance into the cavity, inserting a film between the first and second tools, closing the press and carrying out a first pressing, hardening the first polymer to form a luminescence conversion layer in the press, opening the press, wherein the luminescence conversion layer adhering to the film remains in the press, introducing a second polymer including scattering particles into the cavity, closing the press and carrying out a second pressing, hardening the second polymer to form a scattering layer disposed on the luminescence conversion layer, opening the press, and removing the support film with the layer composite including the luminescence conversion layer and the scattering layer.

11 Claims, 3 Drawing Sheets

(56) References Cited

U.S. PATENT DOCUMENTS

| | | | |
|---|---|---|---|
| 2007/0090387 A1* | 4/2007 | Daniels et al. | 257/99 |
| 2008/0079015 A1* | 4/2008 | Krummacher | 257/98 |
| 2008/0111284 A1 | 5/2008 | Yoo et al. | |
| 2008/0283864 A1* | 11/2008 | LeToquin et al. | 257/101 |
| 2009/0050911 A1* | 2/2009 | Chakraborty | 257/89 |
| 2009/0065790 A1* | 3/2009 | Chitnis et al. | 257/88 |
| 2009/0256167 A1* | 10/2009 | Peeters et al. | 257/98 |
| 2010/0102251 A1* | 4/2010 | Ferrini et al. | 250/484.4 |
| 2010/0119839 A1* | 5/2010 | Chen | 428/422 |
| 2013/0062592 A1* | 3/2013 | Yen | 257/13 |
| 2013/0187178 A1* | 7/2013 | Tischler | 257/88 |
| 2013/0207141 A1* | 8/2013 | Reiherzer | 257/98 |
| 2013/0221393 A1* | 8/2013 | Mao et al. | 257/98 |
| 2013/0240834 A1* | 9/2013 | Tran et al. | 257/13 |

FOREIGN PATENT DOCUMENTS

| | | |
|---|---|---|
| DE | 10 2007 053 286 A1 | 4/2009 |
| DE | 10 2008 021 436 A1 | 5/2010 |
| DE | 10 2009 034 370 A1 | 1/2011 |
| JP | 3-230337 A | 10/1991 |
| JP | 2008-91911 | 4/2008 |
| JP | 2010-42548 | 2/2010 |
| WO | 97/50132 A1 | 12/1997 |
| WO | 98/12757 A1 | 3/1998 |
| WO | 2011/009677 A2 | 1/2011 |

* cited by examiner

PROCESS FOR PRODUCING A LAYER COMPOSITE CONSISTING OF A LUMINESCENCE CONVERSION LAYER AND A SCATTERING LAYER

RELATED APPLICATIONS

This is a §371 of International Application No. PCT/EP2011/062470, with an international filing date of Jul. 20, 2011 (WO 2012/022576 A1, published Feb. 23, 2012), which is based on German Patent Application No. 10 2010 034 923.2, filed Aug. 20, 2010, the subject matter of which is incorporated herein by reference.

TECHNICAL FIELD

This disclosure relates to a process of producing a layer composite which has a luminescence conversion layer and a scattering layer, wherein the layer composite is provided in particular for use in a radiation-emitting optoelectronic component.

BACKGROUND

WO 97/50132 discloses a radiation-emitting optoelectronic component in which at least some of the radiation emitted by an active layer of the optoelectronic component is converted by a luminescence conversion layer to longer wavelengths. In this manner, mixed-color or white light can be produced, e.g., with a radiation-emitting active zone which emits ultraviolet or blue light. By the luminescence conversion layer, ultraviolet or blue light is thereby generally converted into light of a longer wavelength, in particular into light of a complementary color such as yellow, for example, to generate white light.

In the case of that type of generation of white light by luminescence conversion, the visual impression of the optoelectronic component in the switched-off state is often unsatisfactory. The reason for this is that in a bright environment even when the optoelectronic component is in the switched-off state the luminescence conversion layer is excited to emit yellow light which, however, in contrast to the operating state is not mixed with emitted ultraviolet or blue light to produce white light. As a consequence, the surface of the optoelectronic component in the switched-off state has, in the regions provided with the luminescence conversion layer, the color of the longer wavelength generated by luminescence conversion, e.g., yellow, which is often perceived by observers as unattractive. This is the case in particular with comparatively large-scale illumination units which are based, e.g., upon organic light-emitting diodes (OLEDs), but also with LEDs or LED modules having one or a plurality of radiation-emitting semiconductor chips.

To reduce the yellow color impression of the luminescence conversion layer when a radiation-emitting, optoelectronic semiconductor chip is in the switched-off state, it is proposed in DE 10 2006 051 746 A1 to dispose a light-scattering layer, which contains, e.g., scattering particles, above the luminescence conversion layer.

In the case of radiation-emitting, optoelectronic components which have that type of layer sequence consisting of a luminescence conversion layer and a scattering layer, the resulting color impression in the switched-on and/or switched-off state depends in particular upon the thicknesses of the luminescence conversion layer and the scattering layer and upon the properties of the boundary surfaces of these layers. In particular, deviations in the layer thicknesses of the luminescence conversion layer and/or the scattering layer can lead to a deviation in the color impression of the optoelectronic component from a desired reference value.

It could therefore be helpful to provide a process of producing a layer composite having a luminescence conversion layer and a scattering layer, which renders it possible to produce the layers of the layer composite with a high degree of precision in relation to the layer thicknesses and dimensions thereof, wherein the production outlay is relatively small.

SUMMARY

We provide a process of producing a layer composite including a luminescence conversion layer and a scattering layer in which a molding press having a first pressing tool with a cavity and a second pressing tool is used including introducing a first polymer including a luminescence conversion substance into the cavity, inserting a support film between the first and the second pressing tool, closing the molding press and carrying out a first pressing procedure, hardening the first polymer to form a luminescence conversion layer in the molding press, opening the molding press wherein the luminescence conversion layer adhering to the support film remains in the molding press, introducing a second polymer including scattering particles into the cavity, closing the molding press and carrying out a second pressing procedure, hardening the second polymer to form a scattering layer disposed on the luminescence conversion layer in the molding press, opening the molding press, and removing the support film with the layer composite including the luminescence conversion layer and the scattering layer.

DETAILED DESCRIPTION

Figure 1:
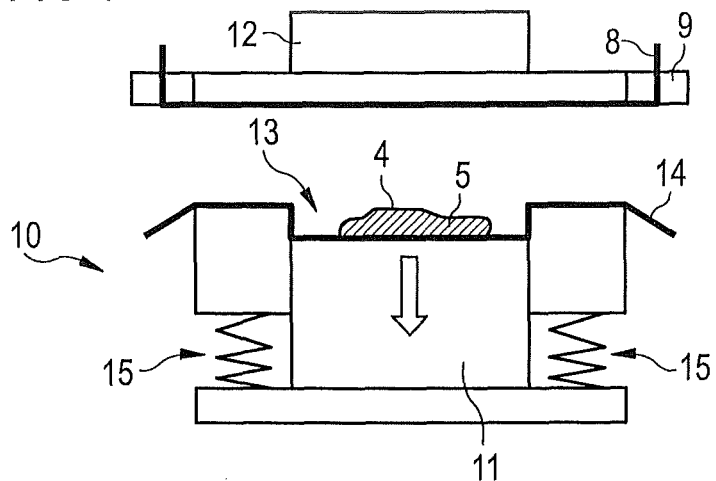
FIGS. 1 to 8 show a schematic illustration of an example of a process of producing a layer composite consisting of a luminescence conversion layer and a scattering layer using intermediate steps.

In the case of the process of producing a layer composite having a luminescence conversion layer and a scattering layer, a compression molding process is employed. A molding press is used which has a first pressing tool and a second pressing tool. The first pressing tool is, e.g., the lower pressing tool and the second pressing tool is the upper pressing tool of the molding press. During the pressing procedure, the first pressing tool and the second pressing tool can be compressed at high pressure to press a material, in particular a polymer, located in the press to form a shape defined by the shape of the pressing tools.

Preferably, the first pressing tool, in particular the lower pressing tool of the molding press, has a cavity into which a preferably liquid polymer can be introduced.

In the process, a first polymer which contains a luminescence conversion substance is introduced into the cavity of the first pressing tool. The thickness of the luminescence conversion layer produced by the process can be advantageously adjusted very precisely by the fill quantity of the first polymer introduced into the cavity of the first pressing tool.

Furthermore, a support film is inserted in the process between the first pressing tool and the second pressing tool. The support film is used for the purpose of being able to remove the layer composite in a convenient manner from the molding press after the process has been carried out. The support film used is preferably a particularly temperature-stable film, e.g., consisting of PI (polyimide) or ETFE (ethylene tetrafluoroethylene).

The molding press is then closed and a first pressing procedure is carried out. The first polymer is then hardened in the preferably still closed moulding press to form a luminescence conversion layer.

The molding press is then opened, wherein the produced luminescence conversion layer adheres to the support film. At this point in time, the support film having the luminescence conversion layer adhering thereto is still not removed from the molding press, but rather continues to remain in the molding press. In particular, the support film having the luminescence conversion layer adhering thereto can be held on the second pressing tool.

A second polymer which contains scattering particles is then introduced into the cavity of the first pressing tool. As in the case of the luminescence conversion layer, the thickness of the scattering layer produced by the process can be adjusted very precisely by the fill quantity of the second polymer introduced into the cavity of the first pressing tool.

The molding press is then reclosed and a second pressing procedure is carried out in which the second polymer is pressed onto the luminescence conversion layer still present in the molding press.

The second polymer is then hardened in the preferably still closed molding press to form a scattering layer disposed on the luminescence conversion layer. The molding press is then opened and the support film together with the layer composite consisting of luminescence conversion layer and the scattering layer is removed.

The layer composite consisting of the luminescence conversion layer and the scattering layer which adheres to the support film can then be removed from the support film and applied in particular to a radiation-emitting, optoelectronic semiconductor chip.

The described process of producing a layer composite consisting of the luminescence conversion layer and the scattering layer renders it possible in an advantageous manner to achieve a high level of precision in relation to planarity, plane parallelism, layer thickness and roughness of the luminescence conversion layer and the scattering layer. Upon application of the layer composite to a radiation-emitting semiconductor chip, good homogeneity is advantageously achieved with regard to white impression, chromaticity coordinate and brightness. In particular, these variables can be effectively reproduced in series production.

Preferably, the first polymer and the second polymer have the same base material. "Base material" is understood to be the material into which, in the case of the luminescence conversion layer, the luminescence conversion substance is embedded and, in the case of the scattering layer, the scattering particles are embedded. In an advantageous manner, the base material of the luminescence conversion layer and scattering layer is therefore the same apart from these embedded additives. On the one hand, this has the advantage that the luminescence conversion layer and the scattering layer adhere well to one another. Furthermore, reflection losses at the boundary surface between the luminescence conversion layer and the scattering layer are reduced in this manner.

Advantageously, the base material of the luminescence conversion layer and/or scattering layer is a silicone. Silicones are characterized by high long-term stability, in particular low sensitivity to UV-radiation.

Preferably, the support film is fixed onto a support frame. The support film can conveniently be inserted into the molding press with the support frame and then be removed after the pressing procedures.

Prior to introduction of the first and/or second polymer, a film is preferably inserted into the cavity of the first pressing tool. In this manner, the cavity and the material introduced into the cavity are advantageously protected against contamination. Preferably, a film is used to which the first and/or second polymer introduced into the cavity adhere(s) only slightly. This ensures that the luminescence conversion layer produced in the pressing procedure continues to adhere to the support film, but not to the film in the cavity.

The film inserted into the cavity is preferably fixed in the cavity by a negative pressure. For example, the cavity can have intake openings which can be connected to a vacuum pump. By virtue of the fact that the film is fixed in the cavity by a negative pressure, it adapts in an advantageous manner to the contour of the cavity.

The cavity in the first pressing tool is advantageously evacuated after closure of the molding press, before the pressing procedure is carried out. This prevents, in the luminescence conversion layer and/or scattering layer produced in the pressing procedure, the occurrence of air inclusions or inhomogeneities in thickness which could result in color inhomogeneities in an optoelectronic component.

The luminescence conversion layer preferably has a thickness of 10 µm to 200 µm. Like the luminescence conversion layer, the scattering layer produced in the second pressing procedure also preferably has a thickness of 10 µm to 200 µm. In particular, the luminescence conversion layer and the scattering layer can have the same thickness.

Suitable luminescence conversion substances contained in the luminescence conversion layer are described, e.g., in WO 98/12757, the subject matter of which is hereby incorporated herein by reference. The scattering particles contained in the scattering layer can be in particular particles consisting of $TiO_2$. However, other particles can also be used, whose refractive index differs from the refractive index of the base material of the scattering layer such as, e.g., particles consisting of $Al_2O_3$ or particles consisting glass or synthetic material which are, e.g., spherical or in the form of hollow spheres. The scattering particles preferably have a radius of 50 nm to 1000 nm.

After production, the layer composite consisting of the luminescence conversion layer and the scattering layer can be cut to a desired size preferably by punching, cutting, water jet cutting or with a laser beam.

The layer composite consisting of the luminescence conversion layer and the scattering layer can be applied in particular to a radiation-emitting, optoelectronic semiconductor chip. In particular, the layer composite can be adhered to the semiconductor chip. The layer composite is applied to the optoelectronic semiconductor chip such that the luminescence conversion layer faces towards the semiconductor chip so that the scattering layer follows the luminescence conversion in the emission direction of the radiation which is emitted by the optoelectronic semiconductor chip.

Our processes will be explained in greater detail hereinafter with reference to examples in conjunction with FIGS. 1 to 9.

Like parts or parts acting in an identical manner are each provided with the same reference numerals in the Drawings. The illustrated parts and the size ratios of the parts with respect to each other are not to be regarded as being to scale.

In the case of the process described herein, the layer composite consisting of a luminescence conversion layer and a scattering layer is produced by compression molding. FIG. 1 illustrates a first intermediate step of the process. In the process, a molding press 10 is used which is illustrated schematically in cross-section in FIG. 1. The molding press 10 has a first pressing tool 11 and a second pressing tool 12. For example, the first pressing tool 11 is the lower pressing tool and the second pressing tool 12 is the upper pressing tool. The first pressing tool 11 has a cavity 13 into which a liquid polymer can be introduced prior to the pressing procedure.

The size of the cavity 13 can be adapted to the fill quantity, e.g., by a spring assembly 15. Prior to filling the cavity 13, a film 14 is preferably inserted into the cavity 13 and protects the cavity 13 against contamination and, after the pressing procedure, facilitates removal of the molded part produced in the pressing procedure. The film 14 can contain, e.g., ETFE (ethylene tetrafluoroethylene). The film 14 is drawn in an advantageous manner by a negative pressure such that it adapts to the contour of the cavity 13. The lower pressing tool 11 can have intake openings (not shown) suitable for this purpose. Furthermore, prior to the pressing procedure, a support film 8 is preferably inserted between the first pressing tool 11 and the second pressing tool 12. In the case of the example of FIG. 1, the support film 8 is fixed onto a support frame 9, wherein the support frame 9 is fixed on the second pressing tool 12.

A liquid first polymer 4 is introduced into the cavity 13. The first polymer 4 serves to produce the luminescence conversion layer and preferably has a silicone as the base material. The base material contains a luminescence conversion substance 5. Suitable luminescence conversion substances are known, e.g., from WO 97/50132 and are therefore not explained in greater detail.

Figure 2:
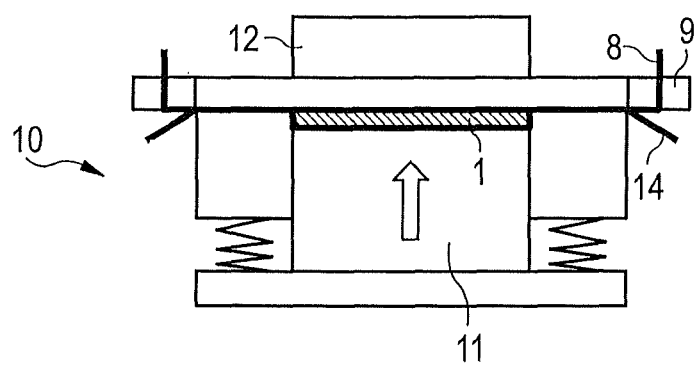

In the intermediate step illustrated in FIG. 2, the molding press 10 has been closed to carry out a first pressing procedure in which the first pressing tool 11 and the second pressing tool 12 are pressed against each other under high pressure. In an advantageous manner, the molding press 10 is evacuated after closure and before the pressing procedure is carried out to prevent air inclusions from forming in the layer produced in the pressing procedure. The polymer contained between the pressing tools 11, 12 is pressed in this manner to form a luminescence conversion layer 1 which is advantageously planar and uniformly thick. The luminescence conversion layer 1 preferably has a thickness of 10 μm to 200 μm, which can be adjusted by the quantity of the previously introduced first polymer. The luminescence conversion layer 1 is hardened preferably in the still closed molding press 10 such that it is dimensionally stable.

Figure 3:
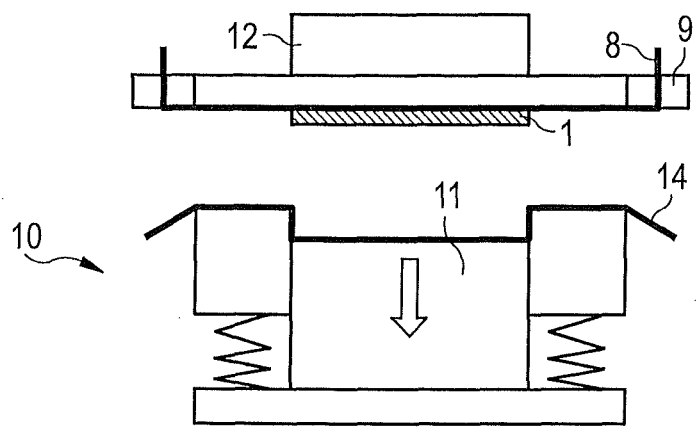

In the intermediate step illustrated in FIG. 3, the molding press 10 has been opened. The luminescence conversion layer 1 produced in the first pressing procedure advantageously adheres to the support film 8 which is attached to the second pressing tool 12 by the support frame 9. To ensure that, after opening of the molding press 10, the luminescence conversion layer 1 adheres to the support film 8 and not to the film 14 in the first pressing tool 11, the material used for the support film 8 is preferably one to which the polymer of the luminescence conversion layer 1 adheres more strongly than to the material of the film 14. In particular, an ethylene tetrafluoroethylene (ETFE) or a polyimide (PI) can be used as the material for the support film 8.

Figure 4:
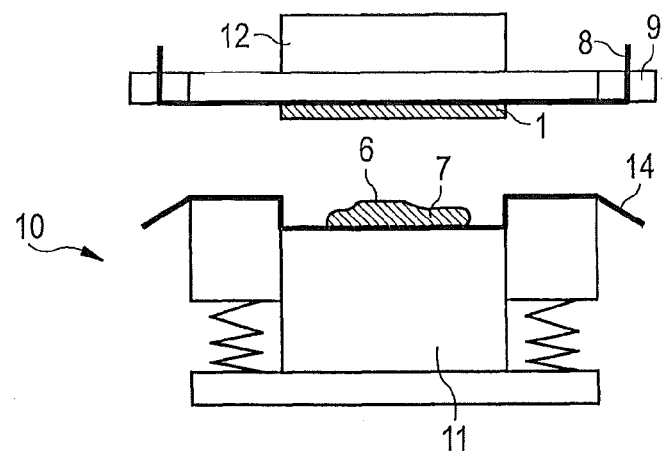

In the intermediate step illustrated in FIG. 4, a second polymer 6 has been introduced into the cavity 13 of the first pressing tool 11. The second polymer 6 serves to produce the scattering layer and preferably contains a silicone as the base material to which scattering particles 7 are added. The scattering particles 7 are, e.g., $TiO_2$ particles. However, other materials whose refractive index differs from the refractive index of the base material of the second polymer 6 can also be used as the scattering particles 7.

The previously produced luminescence conversion layer 1 is still located in the molding press 10 and is attached to the second pressing tool 12 by the support frame 9 of the support film 8 above the cavity 13.

Figure 5:
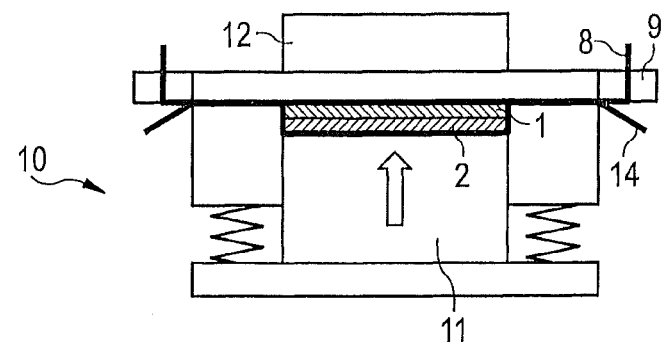

In the intermediate step illustrated in FIG. 5, a second pressing procedure is carried out in which the previously introduced second polymer which contains the scattering particles is pressed to form a scattering layer 2. In an advantageous manner, the molding press 10 is evacuated once again prior to the pressing procedure. During the pressing procedure, the scattering layer 2 is pressed onto the previously produced luminescence conversion layer 1. The scattering layer 2 produced in the second pressing procedure preferably has a thickness of 10 μm to 200 μm. By pressing the scattering layer 2 onto the luminescence conversion layer 1, a layer composite is produced which is advantageously characterized by very planar boundary surfaces and good homogeneity in the thicknesses of the two layers. In an advantageous manner, the scattering layer 2 is still hardened in the closed molding press 10.

Figure 6:
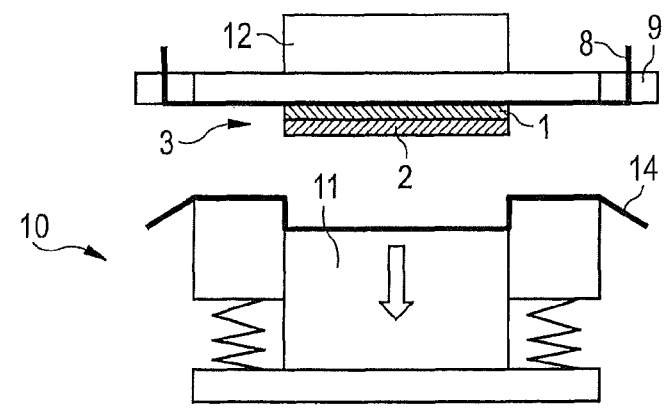

In the intermediate step illustrated in FIG. 6, the molding press 10 is opened. The layer composite 3 which consists of the luminescence conversion layer 1 and the scattering layer 2 applied thereto adheres to the support film 8 which is attached to the second pressing tool 12 by the support frame 9. The luminescence conversion layer 1 and the scattering layer 2 adhere particularly well to one another if they are produced from the same base material. Apart from the embedded luminescence conversion substances and the scattering particles, the luminescence conversion layer 1 and the scattering layer 2 are advantageously formed from the same polymer, in particular a silicone.

Figure 7:
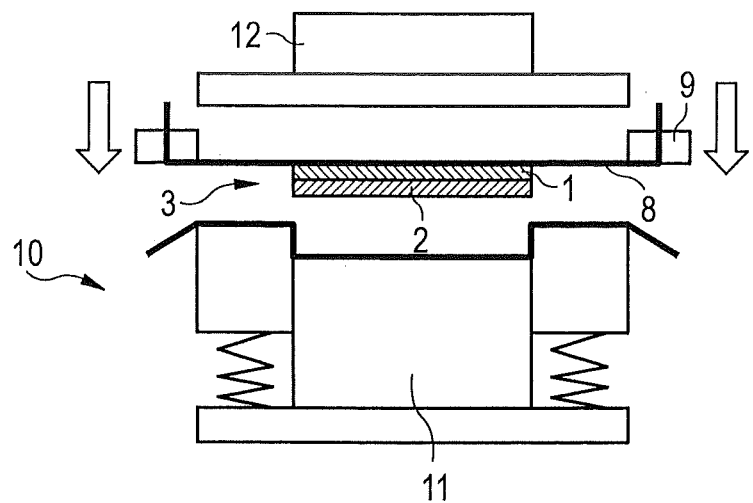

The support film 8 with the layer composite 3 adhering thereto and consisting of the luminescence conversion layer 1 and the scattering layer 2 can then be removed from the molding press 10 by the support frame 9, as illustrated in FIG. 7.

Figure 8:
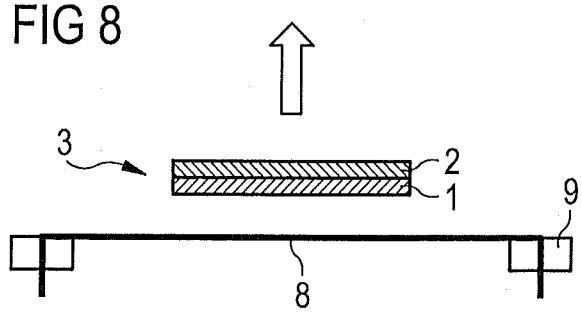

The layer composite 3 can then be removed from the support film 8, as illustrated in FIG. 8. If necessary, the layer composite 3 can then be cut to a size required for the application, e.g., by punching, cutting, water jet cutting and laser beam cutting.

Figure 9:
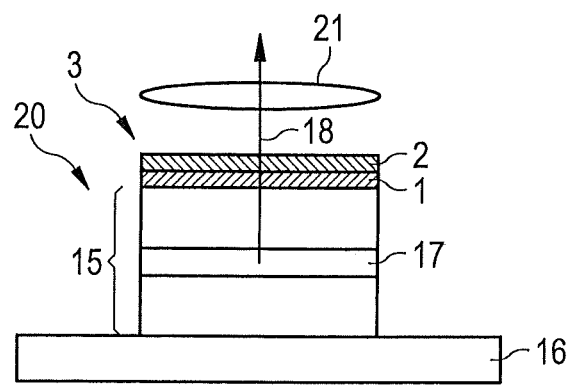
FIG. 9 shows a schematic illustration of an example of an optoelectronic semiconductor chip with the layer composite.

The layer composite 3 produced in this manner consists of the luminescence conversion layer 1 and the scattering layer 2 and can be applied in particular to an optoelectronic semiconductor chip, in particular an LED. FIG. 9 illustrates an example of an optoelectronic semiconductor chip 20 in which the layer composite 3 consisting of the luminescence conversion layer 1 and the scattering layer 2 is applied to the semiconductor layer sequence 15 of the semiconductor chip 20.

The semiconductor layer sequence 15 applied, e.g., to a support substrate 16 has an active layer 17 which emits electromagnetic radiation. In particular, the active layer 17 can emit ultraviolet or blue radiation. In particular, a semiconductor layer sequence 15 based upon a nitride compound semiconductor material is suitable for this purpose.

With the luminescence conversion layer 1, some of the radiation emitted by the active layer 17 is converted into a longer wavelength, e.g., yellow light. Therefore, a mixed light 18 which comprises the primary radiation emitted by the active layer and the radiation converted in the luminescence conversion layer 1 is emitted by the semiconductor chip 20. The mixed light 18 can be in particular white light. The scattering layer 2 on the luminescence conversion layer 1 has the advantage that it reduces a yellowish color impression of the luminescence conversion layer 1 when the semiconductor chip 20 is in the switched-off state.

An optical element such as, e.g., a lens 21, can be disposed downstream of the semiconductor chip 20 in the emission direction. In this case, the undesired effect can occur, namely that some of the radiation impinging upon the inner side of the lens 21 facing towards the semiconductor chip 20 is reflected back in the direction of the semiconductor chip 20. This radiation which is reflected back in the direction of the semiconductor chip 20 is advantageously reflected back by the scattering layer 2 in the emission direction.

Our processes are not limited by the description using the examples. Rather, this disclosure includes any new feature and any combination of features included in particular in any combination of features in the appended claims, even if the feature or combination itself is not explicitly stated in the claims or examples.

The invention claimed is:

1. A process of producing a layer composite comprising a luminescence conversion layer and a scattering layer, in which a molding press having a first pressing tool with a cavity and a second pressing tool is used, comprising:
   introducing a first polymer comprising a luminescence conversion substance into the cavity,
   inserting a support film between the first and the second pressing tool,
   closing the molding press and carrying out a first pressing procedure,
   hardening the first polymer to form a luminescence conversion layer in the molding press,
   opening the molding press, wherein the luminescence conversion layer adhering to the support film remains in the molding press,
   introducing a second polymer comprising scattering particles into the cavity,
   closing the molding press and carrying out a second pressing procedure,
   hardening the second polymer to form a scattering layer disposed on the luminescence conversion layer in the molding press,
   opening the molding press, and
   removing the support film with the layer composite comprising the luminescence conversion layer and the scattering layer.

2. The process according to claim 1, wherein the first polymer and the second polymer have the same base material.

3. The process according to claim 2, wherein the base material is a silicone.

4. The process according to claim 1, wherein the support film is fixed onto a support frame.

5. The process according to claim 1, wherein, prior to introduction of the first polymer and/or introduction of the second polymer, a film is inserted into the cavity of the first pressing tool.

6. The process according to claim 5, wherein the film is fixed in the cavity by a negative pressure.

7. The process according to claim 1, wherein the cavity is evacuated after closure of the molding press and prior to carrying out the pressing procedure.

8. The process according to claim 1, wherein the luminescence conversion layer has a thickness of 10 μm to 200 μm.

9. The process according to claim 1, wherein the scattering layer has a thickness of 10 μm to 200 μm.

10. The process according to claim 1, further comprising cutting the layer composite by sawing, punching, cutting, water jet cutting or laser beam cutting.

11. The process according to claim 1, further comprising applying the layer composite comprising the luminescence conversion layer and the scattering layer to a radiation-emitting, optoelectronic semiconductor chip.

* * * * *